(12) United States Patent
Myers et al.

(10) Patent No.: US 6,388,928 B1
(45) Date of Patent: May 14, 2002

(54) METHOD AND SYSTEM FOR REDUCTION OF TEST TIME FOR ANALOG CHIP MANUFACTURING

(75) Inventors: Theodore M. Myers, Los Altos; Richard V. Orlando, Los Gatos, both of CA (US)

(73) Assignee: Summit Microelectronics, Inc., Cambell, CA (US)

( * ) Notice: Subject to any disclaimer, the term of this patent is extended or adjusted under 35 U.S.C. 154(b) by 0 days.

(21) Appl. No.: 09/852,603

(22) Filed: May 10, 2001

(51) Int. Cl.[7] .................................................. G11C 7/00
(52) U.S. Cl. .............. 365/201; 365/189.02; 365/189.12
(58) Field of Search ........................... 365/201, 189.02, 365/230.02, 189.12

(56) References Cited

U.S. PATENT DOCUMENTS 5,870,621 A * 2/1999 Walsh et al. ............ 395/750.01
5,933,594 A * 8/1999 La Joie et al. .......... 395/183.01

* cited by examiner

*Primary Examiner*—Son T. Dinh
(74) *Attorney, Agent, or Firm*—Fernandez & Associates, LLP.

(57) ABSTRACT

Analog integrated circuits have their individual characteristics compensated by the settings of self-contained non-volatile memory elements. The settings of the memory elements are determined by repeatedly testing the possible values until an optimal one is chosen. The testing process is accelerated by eliminating the need to re-write the non-volatile memory for each value that is tested.

11 Claims, 3 Drawing Sheets

METHOD AND SYSTEM FOR REDUCTION OF TEST TIME FOR ANALOG CHIP MANUFACTURING

FIELD OF INVENTION

The invention pertains to the field of manufacturing of analog integrated chips. In particular to methods of adjusting fabricated circuits to compensate for unavoidable differences inherent in the semiconductor manufacturing process.

BACKGROUND

The manufacturing of an integrated circuit (chip) is an inexact process. Uncontrolled variations in manufacturing result in each chip having a unique set of electrical parameters. The types, sizes and distributions of these differences are well known. These variances are contrary to the goal of the manufacturing process, which is the production of quantities of identical devices. Since the variances cannot be eliminated, it ultimately falls upon designers to devise a mechanism to address this variability.

Digital design techniques are generally quite tolerant of a wide range of device characteristics, resulting in devices with differences in speed. System-level design techniques, such as synchronous clocking, allow for the use of a device with a wide range of characteristics, if it is above a specified minimum speed.

Analog designers have a more difficult problem; minute variations in device characteristics can result in large changes in the overall response. Often, the digital designer's techniques of overcoming these variances are inappropriate for the analog designer. The techniques used by analog designers can be roughly divided into two categories. In the first category, circuit techniques automatically compensate for inter-device variance. Unfortunately, for many design problems, an automatic compensation circuit is not known or is prohibited. In the second category, each individual device is characterized and adjusted to provide compensation for parametric variation.

A common technique for adjusting individual devices is to augment a circuit with an element, such as a digital to analog converter, whose output provides influence on the response sufficient to compensate for inter-device variations. We will refer to this type of circuit element as a compensator. Each circuit is tested to determine the correct setting of the compensator for that circuit. Since it is the desire of the analog circuit vendor to provide quantities of chips that appear identical, the individual setting for the compensator is preferentially stored within the device itself using a non-volatile digital memory. This programming is done by the vendor before delivery of the chip to the customer. Thus, the customer sees the desired end—quantities of identical chips. Any of the well-known non-volatile digital memory techniques can be used to store the individual setting including: programmable read-only memory (PROM), erasable programmable read-only memory (EPROM), electrically erasable programmable read-only memory (EEPROM), FLASH memory and others; however, EEPROM is frequently used, as it is simpler to construct within a typical analog semiconductor fabrication process.

The testing of the circuit is done by programming the non-volatile memory to each of its possible values in turn and then measuring the response of the circuit on the chip. From these measurements, the optimal setting of the compensator is determined and programmed into the memory for final shipment. In some cases, the response characteristics of the analog circuit may allow testing less than every possible setting of the non-volatile memory. For example, if the analog circuit response is monotonic with respect to compensator settings, then on average only one half of the possible settings need be measuring before observing the optimal value.

The increasing capability of the semiconductor manufacturing process (due to the shrinking of minimum critical dimensions) has lead to two key trends in the analog-chip market. One trend is an increase in the number and complexity of circuits integrated onto a single chip. Another trend is an increase in the precision of these circuits. These two trends have combined to increase the number of programmable bits, for the setting of compensators, present on an analog chip.

Correspondingly, each individual chip must spend greater amounts of time in the test process as each of the possible compensator values is tried and measured. The programming of non-volatile memory is known to be a slow process, causing it to consume the largest part of the test time. Often, the amount of time spent in the testing process is a significant, if not a dominant, portion of the manufacturing cost of the chip. Accordingly, a method of reducing the time spent testing a chip to determine the setting of its compensators is needed.

SUMMARY OF THE INVENTION

The standard compensator circuit is augmented with an additional digital register and multiplexer, removing the need to program the non-volatile memory for each possible compensator setting. The time to test each possible compensator setting is correspondingly reduced, resulting in a dramatic reduction in test time for the entire device.

DETAILED DESCRIPTION OF THE PREFERRED EMBODIMENT

A method and system for reducing test time is disclosed. In the following descriptions, numerous specific details are set forth, such as the specific rendering of the implementation, in order to provide a thorough understanding of the present invention. It will be apparent, however, to one skilled in the art that the present invention may be practiced without these specific details. In other instances, well-known circuits, control logic and coding techniques have not been shown in detail, in order to avoid unnecessarily obscuring the present invention.

Figure 1:
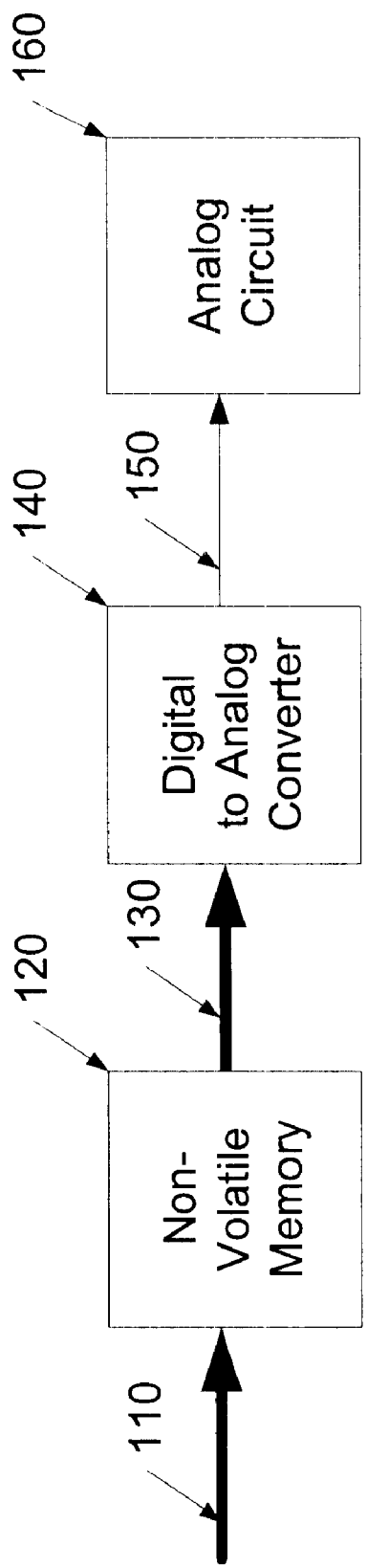
FIG. 1 shows a prior art compensator circuit.

FIG. 1 shows a prior-art compensator circuit. Test bus 110 controls and programs non-volatile memory 120. In a preferred embodiment, test bus 110 is a low-speed serial bus such as SMBUS, I²C or JTAG, but any communications mechanism would be equally applicable. Non-volatile memory 120 drives bus 130 to the particular value previously programmed by test bus 110 into non-volatile memory 120. Digital-to-analog converter 140 drives line 150 to a voltage level determined by the value programmed into non-volatile memory 120. The voltage present on line 150 adjusts the response of analog circuit 160.

The circuit designer, anticipating inter-device variations, provides digital-to-analog converter 140 with sufficient range to alter analog circuit 160 to obtain the desired response across the expected variability of device parameters for the manufacturing process. Increasing the precision of digital-to-analog converter 140 allows finer control of the response of analog circuit 160.

During the programming process, each value for non-volatile memory 120 is programmed through test bus 110 and then the response of analog circuit 160 is measured. The value of non-volatile memory 120 that yields the best response for analog circuit 160 is then programmed into non-volatile memory 120 for shipment. For a circuit with 16 bits of non-volatile memory up to 65536 settings are possible. A typical non-volatile write-cycle is approximately 10 mSec yielding a minimum overall test time of 655 seconds.

Figure 2:
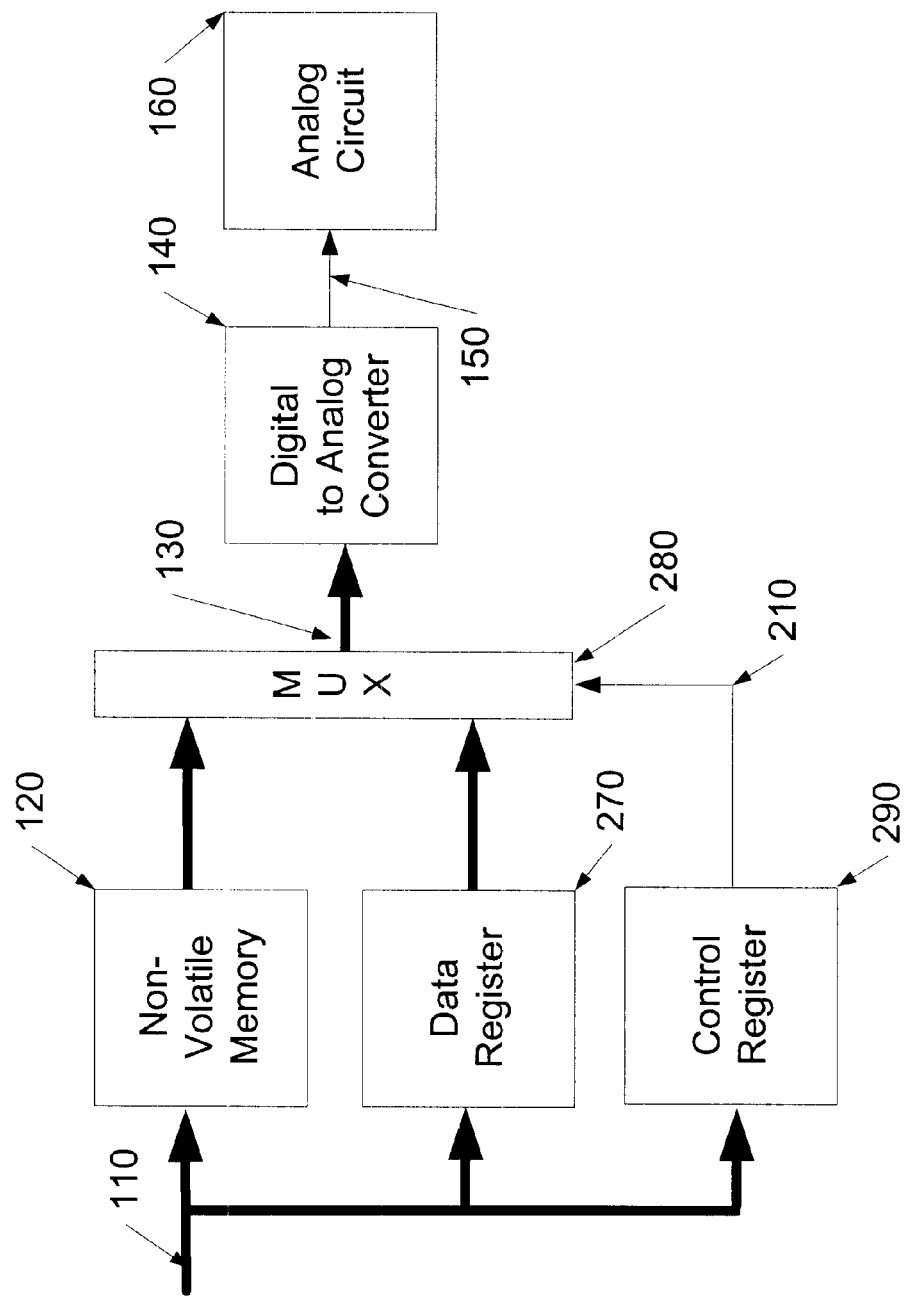
FIG. 2 shows an improved compensator circuit.

FIG. 2 shows a preferred embodiment of an enhanced compensator circuit. Test bus 110 controls data register 270, control register 290 and is able to write non-volatile memory 120. In a preferred embodiment, test bus 110 is a low-speed serial bus such as SMBUS, I²C or JTAG, but any communications bus would be equally applicable. Bus 130 directs digital-to-analog converter 140 to supply a specific voltage to analog circuit 160 via line 150. Multiplexer 280 selects either the output of non-volatile memory 120 or data register 270 to drive bus 130 based on the value of line 210 which is driven by control register 290. Control register 290 places the device into one of two modes: normal or test. In normal mode, control register 290, via line 210, directs multiplexer 280 to select non-volatile memory 120 for output on bus 130. In test mode, control register 290, via line 210, directs multiplexer 280 to select data register 270 for output on bus 130. Control register 290 is designed so that the chip operates in normal mode unless a command is received to switch to test mode. In a preferred embodiment, control register 290 will automatically select normal mode upon power up. Thus in the absence of activity on the test bus, as is expected in non-manufacturing test environments, the value programmed into the non-volatile memory drives digital-to-analog converter 140 to adjust the response of analog circuit 160 via line 150 as in FIG. 1.

A command on test bus 110 will cause control register 290 to switch into test mode causing the value of data register 270 to control the response of analog circuit 160 via bus 130, digital-to-analog converter 140 and line 150. Thus when operating in test mode, it is the value of data register 270 that provides values for digital-to-analog converter 140 rather than non-volatile memory 120.

Figure 3:
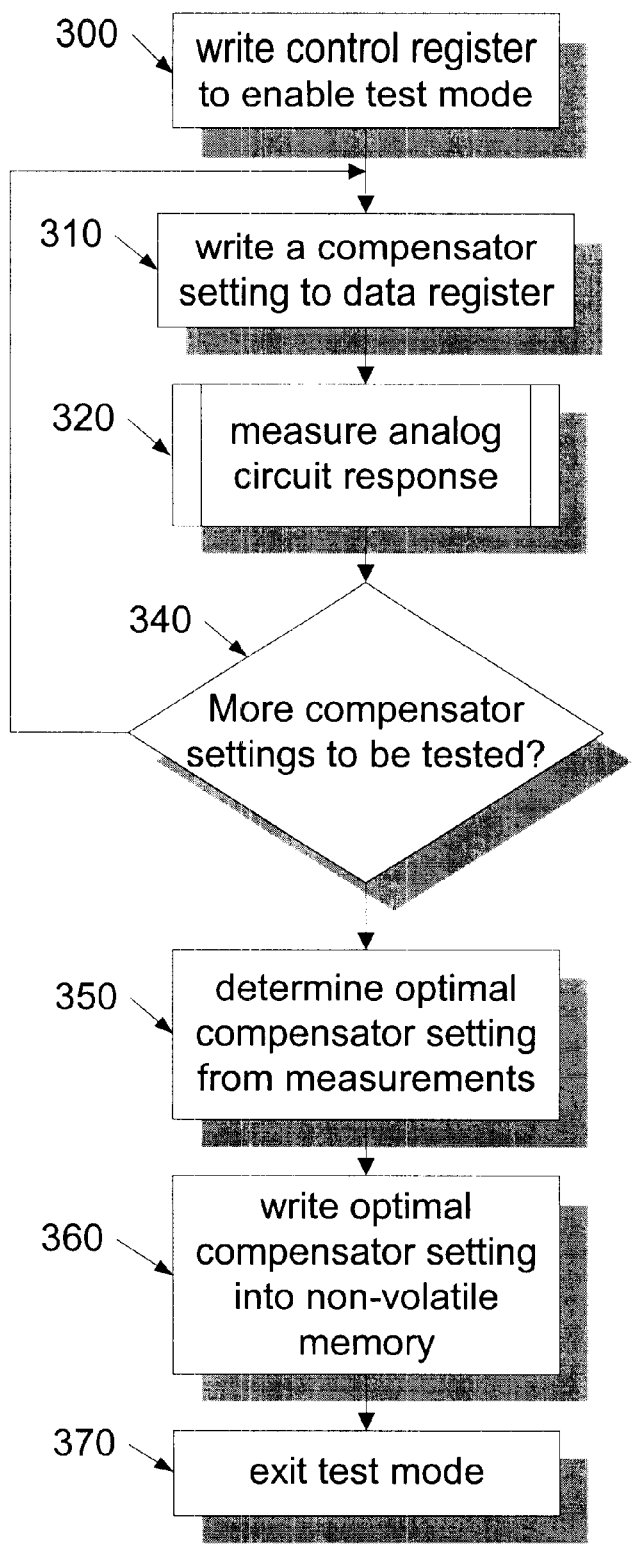
FIG. 3 shows a flowchart of the method of testing an analog circuit using a compensator circuit built according to the principals of the present invention.

FIG. 3 shows a flowchart for the testing process using the circuitry described above. In step 300, control register 290 is written, causing multiplexer 280 to select data register 270 to control digital-to-analog converter 140, placing the device into test mode. In step 310, the next compensator setting to test is written into data register 290 through test bus 110. In step 320, the response of the analog circuit is measured.

In step 340, a decision is made as to whether more compensator settings need to be tested. As mentioned above, in some cases an analog circuit may not need to have every possible compensator setting tested before being able to identify the optimal setting. In other cases, an exhaustive search may be required. If more settings need to be tested, the process repeats by returning to step 310. If no more values are to be tested, the process continues to step 350.

In step 350, the data measured in each execution of step 320 is analyzed to determine the optimal compensation setting. In step 360, the optimal value is written into non-volatile memory 120 using bus 110. Finally, in step 370, the device returns to normal mode. Step 370 can be accomplished either by changing the setting of multiplexer 280 by writing control register 290 through test bus 110 or by power cycling the device which will have the same effect.

The response of analog circuit 160 in FIGS. 1 and 2 is adjusted by a programmable voltage source, i.e., digital-to-analog converter 140. It should be understood that alternate adjustment strategies are possible. For example, programmable resistors, capacitors, inductors, or current sources could be used; combinations of programmable elements are also possible. The technique disclosed is equally applicable to any of these adjustment strategies.

FIG. 2 shows a single test bus controlling the non-volatile memory, the data register and the control register. The use of a single bus is merely illustrative and not limiting, it should be understood that a plurality of test buses could be used to control these elements separately or in any combination.

The use of the term bus, herein, should be understood not to be limited to a direct connection with a plurality of wires.

What is claimed is:

1. A system for compensating the response of an analog integrated circuit comprising:
   a non-volatile memory;
   a data register;
   a control register;
   a compensator generating an adjustment signal;
   a multiplexer; wherein the control input of said multiplexer is coupled to said control register, a first data input of said multiplexer is coupled to said non-volatile memory, a second data input of said multiplexer is coupled to said data register, and the output of said multiplexer is coupled to the input of said compensator;
   one or more test buses for controlling the contents of said non-volatile memory, said control register and said data register; and
   an analog circuit connected to said adjustment signal, wherein the response of said analog circuit is adjusted by said adjustment signal.

2. The system of claim 1 wherein said compensator further comprises: a digitally controlled voltage source.

3. The system of claim 1 wherein said compensator further comprises: a digitally controlled current source.

4. The system of claim 1 wherein said compensator further comprises: a digital to analog converter.

5. The system of claim 1 wherein said non-volatile memory is a programmable read-only memory.

6. The system of claim 2 wherein said non-volatile memory is a programmable read-only memory.

7. The system of claim 3 wherein said non-volatile memory is a programmable read-only memory.

8. The system of claim 4 wherein said non-volatile memory is a programmable read-only memory.

9. The system of claim 5 wherein said programmable read-only memory is electrically erasable.

10. A method of setting a compensation circuit for an analog circuit comprising the steps of:

placing said compensation circuit in a test mode;

setting a volatile register to one of a plurality of compensation values;

measuring the response of said analog circuit;

repeating said setting step and said measuring step with different compensation values;

selecting one compensation value; and programming a non-volatile memory to said one compensation value.

11. The method of claim 10 further including the step of:

examining the plurality of results of said measuring step to determine an optimal compensation value.

* * * * *